United States Patent
Bothe et al.

(10) Patent No.: US 11,682,634 B2
(45) Date of Patent: Jun. 20, 2023

(54) PACKAGED ELECTRONIC CIRCUITS HAVING MOISTURE PROTECTION ENCAPSULATION AND METHODS OF FORMING SAME

(71) Applicant: Wolfspeed, Inc., Durham, NC (US)

(72) Inventors: Kyle Bothe, Cary, NC (US); Dan Namishia, Wake Forest, NC (US); Fabian Radulescu, Chapel Hill, NC (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 124 days.

(21) Appl. No.: 17/060,540

(22) Filed: Oct. 1, 2020

(65) Prior Publication Data
US 2021/0028127 A1 Jan. 28, 2021

Related U.S. Application Data

(62) Division of application No. 15/960,693, filed on Apr. 24, 2018, now Pat. No. 10,811,370.

(51) Int. Cl.
| | |
|---|---|
| H01L 23/528 | (2006.01) |
| H01L 23/31 | (2006.01) |
| H01L 23/66 | (2006.01) |
| H01L 23/64 | (2006.01) |
| H01L 25/065 | (2023.01) |
| H01L 23/00 | (2006.01) |
| H01L 25/00 | (2006.01) |

(52) U.S. Cl.
CPC ............ *H01L 23/564* (2013.01); *H01L 23/31* (2013.01); *H01L 23/528* (2013.01); *H01L 23/642* (2013.01); *H01L 23/645* (2013.01); *H01L 23/66* (2013.01); *H01L 25/0655* (2013.01); *H01L 25/50* (2013.01); *H01L 2223/6683* (2013.01)

(58) Field of Classification Search
None
See application file for complete search history.

(56) References Cited

U.S. PATENT DOCUMENTS

| | | |
|---|---|---|
| 5,786,271 A | 7/1998 | Ohida et al. |
| 6,322,903 B1 | 11/2001 | Siniaguine et al. |

(Continued)

FOREIGN PATENT DOCUMENTS

| | | |
|---|---|---|
| JP | 2008091631 A | 4/2008 |
| JP | 2009043835 A | 2/2009 |

(Continued)

OTHER PUBLICATIONS

"Notification of Transmittal of the International Search Report and the Written Opinion of the International Searching Authority, or the Declaration, corresponding to International Application No. PCT/US2019/026885, dated Jul. 4, 2019".

(Continued)

*Primary Examiner* — Bo B Jang
(74) *Attorney, Agent, or Firm* — Myers Bigel, P.A.

(57) ABSTRACT

A packaged electronic circuit includes a substrate having an upper surface, a first metal layer on the upper surface of the substrate, a first polymer layer on the first metal layer opposite the substrate, a second metal layer on the first polymer layer opposite the first metal layer, a dielectric layer on the first polymer layer and at least a portion of the second metal layer and a second polymer layer on the dielectric layer.

16 Claims, 7 Drawing Sheets

(56) References Cited

U.S. PATENT DOCUMENTS

| | | |
|---|---|---|
| 9,761,439 B2 | 9/2017 | Ring et al. |
| 9,812,338 B2 | 11/2017 | Ring et al. |
| 9,991,399 B2 | 6/2018 | Mieczkowski et al. |
| 9,998,109 B1 | 6/2018 | Das et al. |
| 2004/0099283 A1 | 5/2004 | Waldfried et al. |
| 2011/0049705 A1 | 3/2011 | Liu et al. |
| 2014/0068962 A1 | 3/2014 | Mori et al. |
| 2017/0077079 A1 | 3/2017 | Lan et al. |
| 2017/0020714 A1 | 7/2017 | Liao et al. |
| 2017/0207147 A1 | 7/2017 | Liao et al. |
| 2017/0271258 A1 | 9/2017 | Wood et al. |
| 2017/0271497 A1 | 9/2017 | Fayed et al. |
| 2018/0092189 A1 | 3/2018 | Reier et al. |

FOREIGN PATENT DOCUMENTS

| | | |
|---|---|---|
| JP | 2010192500 A | 9/2010 |
| WO | 2011004874 A1 | 1/2011 |
| WO | 2016136411 A1 | 9/2016 |
| WO | 2017130381 A1 | 8/2017 |
| WO | 2017160707 A1 | 9/2017 |

OTHER PUBLICATIONS

International Preliminary Report on Patentability of the International Searching Authority corresponding to International Application No. PCT/US2019/026885, dated Nov. 5, 2020, 13 pages.
"Notice of Preliminary Rejection in Korean corresponding application No. 10-2022-7032023 dated Nov. 1, 2022, 7 pages".
"Japanese Office Action in Corresponding Patent Application No. 2022-015567, dated Apr. 19, 2023, 3 pages".

PACKAGED ELECTRONIC CIRCUITS HAVING MOISTURE PROTECTION ENCAPSULATION AND METHODS OF FORMING SAME

CROSS-REFERENCE TO RELATED APPLICATION

The present application is a continuation under 35 U.S.C. § 120 of U.S. patent application Ser. No. 15/960,693, filed Apr. 24, 2018, the entire content of which is incorporated herein by reference.

FIELD

The inventive concepts described herein relate to electronic circuits and, more particularly, to packaged electronic circuits having protective encapsulations

BACKGROUND

A wide variety of packaged electronic circuits are known in the art. These circuits may include one or more semiconductor integrated circuit chips and/or other electronic circuit substrates that have discrete electronic components such as capacitors, inductors and/or resistors formed thereon that are contained within a common protective package. By way of example, internally-matched field effect transistor ("FET") power amplifiers are one type of packaged electronic circuit that is known in the art. An internally-matched FET power amplifier may include one or more integrated circuit chips that have a plurality of unit cell transistors that are arranged in parallel to provide a plurality of parallel amplification paths. The unit cell transistors may comprise for example, high electron mobility transistors that may be formed using wide bandgap semiconductor materials such as, for example, silicon carbide and/or gallium nitride-based semiconductor materials. The integrated circuit chip(s) may be packaged in a protective package together with, for example, other electronic circuit substrates such as printed circuit boards or ceramic circuit substrates that include impedance matching networks, transmission lines, power splitting and combining structures and the like. The protective package may include one or more input and output leads or pads. Bond wires may be used to connect the integrated circuit chips and other electronic circuit substrates to each other and/or to the input/output leads of the protective package.

A monolithic microwave integrated circuit ("MMIC") is another packaged electronic circuit that is known in the art. MMIC chips are designed to operate at radio or microwave frequencies, and all of the circuit elements are formed on a single "monolithic" integrated circuit chip that is enclosed in a protective package having appropriate inputs and outputs (e.g., leads). Bond wires may be used to electrically connect circuit elements on the integrated circuit chip to the input/output leads of the protective package. MMIC amplifiers are in wide use today, and include high power MMIC amplifiers (which are typically used on the transmit side of a communications circuit) and low noise MMIC amplifiers (which are typically used on the receive side of a communications circuit). MMIC amplifiers typically include one or more stages of transistor amplifiers and may further include other elements such as impedance matching networks and feed networks that are all implemented on a single integrated circuit chip. MMIC amplifiers typically have a unit cell transistor design in which each amplification stage of the device is implemented as a plurality of "unit cell" transistors that are arranged in parallel to provide a plurality of parallel amplification paths. The unit cell transistors may comprise, for example, high electron mobility transistors that are formed using wide bandgap semiconductor materials. Other common MMIC devices include RF mixers and high frequency switching circuits.

Reliability may be an important performance characteristic for many packaged electronic circuits. For example, MMIC amplifiers are often deployed in or adjacent the antennas of cellular base stations, and hence may be mounted tens or hundreds of feet above the ground. Cellular base station operators often require very high levels of reliability for component manufacturers, as network outages must be kept to a minimum and as replacing failed "tower-top" components requires expensive tower climbs by trained technicians.

SUMMARY

Pursuant to embodiments of the present invention, methods of fabricating packaged electronic circuits are provided. Pursuant to these methods, a first metal layer is formed on a substrate. A first polymer layer is formed at a first temperature on a portion of the first metal layer. A second metal layer is formed on the first polymer layer opposite the first metal layer. A dielectric layer is formed at a second temperature on the second metal layer and on the first polymer layer, the second temperature being less than the first temperature. A second polymer layer is formed at a third temperature on the dielectric layer, the third temperature being less than the second temperature.

In some embodiments, the dielectric layer may be a second dielectric layer, and the method may further include forming a first dielectric layer on the first metal layer prior to forming the second metal layer. In some such embodiments, the first metal layer, the first dielectric layer and the second metal layer may form a capacitor.

In some embodiments, the first polymer layer is formed between the first metal layer and a periphery of the second metal layer, and the first polymer layer has a thickness in a direction perpendicular to an upper surface of the substrate that is greater than a thickness of the first dielectric layer.

In some embodiments, the periphery of the second metal layer may be spaced farther above the first metal layer than is a center of the second metal layer.

In some embodiments, the first metal layer may be coupled to a gate of a transistor.

In some embodiments, the first polymer layer may not be disposed between a center of the second metal layer and the first metal layer.

In some embodiments, the first dielectric layer may be formed on a top surface of the first metal layer, the first polymer layer may be formed on a top surface of at least one of the first metal layer and the first dielectric layer, the second metal layer may be formed on a top surface of the first dielectric layer, the second dielectric layer may be formed on a top surface of the first polymer layer, and the second polymer layer may be formed on a top surface of the second dielectric layer.

In some embodiments, the dielectric layer may include silicon and at least one of oxygen and nitrogen, and the first and second polymer layers may each be carbon-based layers.

In some embodiments, the dielectric layer and the second polymer layer may be formed on a wafer and the method may further include dicing the wafer into individual chips after formation of the dielectric layer and the second polymer layer.

In some embodiments, the second metal layer may be a gate jumper that is coupled between a gate electrode and a gate finger of a transistor.

In some embodiments, the first metal layer may be a metal trace that includes self-coupling sections that have substantially the same instantaneous current direction.

In some embodiments, the packaged electronic circuit may be a monolithic microwave integrated circuit.

In some embodiments, the method may further include forming a plurality of transistors on the substrate. In such embodiments, the dielectric layer may be formed on upper surfaces of the transistors and the second polymer layer may not be formed on the upper surfaces of the transistors.

In some embodiments, the first polymer layer and the second polymer layer may be thicker in a direction perpendicular to an upper surface of the substrate than the first dielectric layer.

Pursuant to further embodiments of the present invention, additional methods of fabricating packaged electronic circuits are provided. Pursuant to these methods, a first metal layer is formed on an upper surface of a substrate. A first dielectric layer is formed on an upper surface of the first metal layer. A first polymer layer is formed on an upper surface of the first metal layer, the first polymer layer having a thickness in a direction perpendicular to the upper surface of the substrate that is greater than a thickness of the first dielectric layer. A second metal layer is formed on the first dielectric layer opposite the first metal layer, where the second metal layer extends onto the first polymer layer. A second dielectric layer is formed on the second metal layer and on the first polymer layer. A second polymer layer is formed on the second dielectric layer. The first polymer layer is formed between the first metal layer and a periphery of the second metal layer, and the first metal layer, the first dielectric layer and the second metal layer form a capacitor.

In some embodiments, the first polymer layer is formed at a first temperature and the second dielectric layer is formed at a second temperature that is lower than the first temperature.

In some embodiments, the second polymer layer is formed at a third temperature that is lower than the second temperature.

In some embodiments, the method further comprises forming a plurality of transistors on the substrate, where the dielectric layer is formed on upper surfaces of the transistors and the second polymer layer is not formed on the upper surfaces of the transistors.

In some embodiments, the second dielectric layer and the second polymer layer are formed on a wafer, and the method further comprises dicing the wafer into individual chips after formation of the second dielectric layer and the second polymer layer.

Pursuant to additional embodiments of the present invention, methods of fabricating packaged electronic circuits are provided in which a first metal trace is formed on a substrate. The first metal trace includes side-by-side self-coupling sections that have substantially the same instantaneous current direction. A first polymer layer is formed on the first metal layer. A second metal layer is formed on the first polymer layer opposite the first metal layer. A dielectric layer is formed on the second metal layer and on the first polymer layer. A second polymer layer is formed on the dielectric layer.

Pursuant to yet additional embodiments of the present invention, packaged electronic circuits are provided that include a substrate having an upper surface, a first metal layer on the upper surface of the substrate, a first polymer layer on the first metal layer opposite the substrate, a second metal layer on the first polymer layer opposite the first metal layer, a dielectric layer on the first polymer layer and at least a portion of the second metal layer and a second polymer layer on the dielectric layer.

In some embodiments, the second metal layer comprises one of a capacitor electrode, a portion of a spiral inductor and a gate bypass jumper.

In some embodiments, the dielectric layer comprises a second dielectric layer, and wherein the packaged electronic circuit further comprises a first dielectric layer between the first metal layer and the second metal layer so that the first metal layer, the first dielectric layer and the second metal layer form a capacitor.

In some embodiments, the first polymer layer is formed between the first metal layer and a periphery of the second metal layer, and wherein the first polymer layer has a thickness in a direction perpendicular to an upper surface of the substrate that is greater than a thickness of the first dielectric layer.

In some embodiments, the periphery of the second metal layer is spaced farther above the first metal layer than is a center of the second metal layer.

In some embodiments, the first polymer layer is not between a center of the second metal layer and the first metal layer.

In some embodiments, the first metal layer is coupled to a gate of a transistor.

In some embodiments, the second metal layer comprises a gate jumper that is coupled between a gate electrode and a gate finger of a transistor.

In some embodiments, the first metal layer comprises a metal trace that includes self-coupling sections that have substantially the same instantaneous current direction.

In some embodiments, the packaged electronic circuit is a monolithic microwave integrated circuit, and wherein a plurality of transistors are provided on the substrate, and wherein the dielectric layer is formed on upper surfaces of the transistors and the second polymer layer is not formed on the upper surfaces of the transistors.

DETAILED DESCRIPTION

Internally-matched FET power amplifiers, MMIC chips and various other packaged electronic circuits may include, for example, a combination of transistors, capacitors, inductors, resistors, circuit traces and/or dielectric crossovers that are arranged to implement a desired functionality. In many instances, a packaged electronic circuit will not include any encapsulation aside from the protective package. Other packaged electronic circuits include integrated circuit chips or other electronic circuit substrates (collectively referred to herein as "chips") that have so-called "die" level passivation in which a potting material or a dielectric layer is deposited on a top side of the chip after the chip is singulated from a larger structure (e.g., a semiconductor wafer) via a dicing operation.

Packaged electronic circuits are often operated at elevated temperatures (since heat builds up within the packaged electronic circuit during operation) and may also be operated, at least part of the time, in high humidity environments. When packaged electronic circuits are operated at elevated temperatures in a humid environment, the water vapor in the ambient air may provide hydrogen or other ions (e.g., chlorine, sodium) that may lead to undesired chemical reactions within the packaged electronic circuit. Even when chip-level passivation is provided, small cracks or imperfections in the passivation layer may allow moisture to pass through the passivation into the interior of the device. Ions, particularly when located near portions of the packaged electronic circuit that are under high electric fields, may act as catalysts for hydroxide formation or other chemical reactions. These chemical reactions may degrade the performance of various of the circuit elements over time or result in device failure. Most typically a humidity-induced failure of an integrated circuit chip or other circuit substrate will occur in a portion of the device that is energized (i.e., has voltages applied thereto) and that is either unpassivated or poorly passivated. Such failures may be referred to herein as "biased humidity failures."

Pursuant to embodiments of the present invention, packaged electronic circuits are provided that include one or more encapsulated integrated circuit chips or other electronic circuit substrates within a protective package. The encapsulation may block the ingress of moisture to electronic circuit elements on the chip(s). In some embodiments, the moisture encapsulation may be performed at the "wafer" level (i.e., the moisture encapsulation layers are applied during wafer processing before the wafer is diced into a plurality of integrated circuit chips). The encapsulation may include, for example, a protective dielectric layer such as a silicon oxide, silicon nitride or silicon oxynitride passivation layer, and a protective polymer layer (e.g., a polyimide layer) that overlies the protective dielectric layer. The combination of the protective dielectric layer and the protective polymer layer may encapsulate the circuit elements on the chip and hence may provide a moisture barrier that may keep ions from the moisture away from the circuit elements.

In various integrated circuit chip and other electronic circuit substrate designs, two or more metal layers may be vertically stacked. Herein, the term "metal layer" encompasses both continuous metal layers and patterned metal layers, and two metal layers (or other circuit elements) are "vertically stacked" if an axis that is perpendicular to a major surface of the chip extends through each of the layers/elements. Examples of such vertically stacked metal layers include the two electrodes of a plate capacitor formed on a circuit substrate or a trace of a spiral inductor that crosses over the spiral to connect the inner portion of the spiral to circuit elements outside of the spiral. In some designs, a so-called dielectric crossover may be interposed between two vertically stacked conductive elements to prevent short-circuits. In some cases the dielectric crossover may be formed of a polymer-based material. In such cases, if a dielectric layer is formed on a polymer-based dielectric crossover, pinholes and/or small cracks may form in the dielectric layer, particularly when the polymer-based dielectric crossover includes indentations or voids. These pinholes/cracks in the dielectric layer may act as paths for moisture ingress through the dielectric layer. The provision of a protective polymer layer over top of the dielectric layer may cover these pinholes/cracks and hence together the dielectric layer and the protective polymer layer may encapsulate the device for purposes of moisture protection.

In some embodiments, the polymer-based dielectric crossover may be formed (e.g., deposited) on the circuit substrate at a first temperature. The protective dielectric layer may then be formed on the polymer-based dielectric crossover at a second temperature that is less than the first temperature. By forming the protective dielectric layer at a lower temperature, out-gassing of materials in the polymer-based dielectric crossover during formation of the protective dielectric layer may be reduced or prevented. Such out-gassing of material, were it to occur, may cause pin-holes in the film, film delamination or film adhesion issues. The protective polymer layer may then be formed on the protective dielectric layer at a third temperature that is less than the second temperature. By forming the protective polymer layer at a lower temperature than the protective dielectric layer (and the polymer-based dielectric crossover), out-gassing of materials in polymer-based dielectric crossover and/or the protective dielectric layer during the formation of the protective polymer layer may be reduced or prevented. Herein, references to a layer being formed at a temperature that is less than the specified temperature mean that the layer is grown, sprayed, coated or otherwise deposited at a temperature that is less than the specified temperature and that any post-deposition steps associated with the proper formation of the layer such as an annealing step are performed at less that the specified temperature.

In some embodiments, the polymer-based dielectric crossover may be provided underneath the periphery of the upper electrode of a plate capacitor. In such embodiments, the capacitor may comprise a first metal layer that acts as a lower electrode of the capacitor, a second metal layer that acts as an upper electrode of the capacitor, and a capacitor dielectric layer that is interposed between the first and second metal layers, where the lower electrode, the capacitor dielectric layer and the upper electrode are vertically stacked. The polymer-based dielectric crossover may be formed between the first metal layer and a periphery of the second metal layer and may not be formed under a central portion of the second metal layer. The polymer-based dielectric crossover may have a thickness that is greater than a thickness of the capacitor dielectric layer. In example embodiments, the polymer-based dielectric crossover may have a thickness of between 1-3 microns, a thickness of between 3-10 microns or a thickness of between 10-100 microns. Since the polymer-based dielectric crossover may have an increased thickness as compared to the capacitor dielectric layer, the periphery of the second metal layer may be spaced farther above the first metal layer than is the central portion of the second metal layer.

In other embodiments, the polymer-based dielectric crossover may be used to isolate a spiral inductive trace that is formed in a first metal layer from a connection trace that is part of a second metal layer. The connection trace connects the end of the spiral inductive trace that is within the interior of the spiral to a circuit element that is outside of the spiral. The spiral inductive trace may include side-by-side sections that have the same or substantially the same instantaneous current direction.

In still other embodiments, the packaged electronic circuit may comprise a power amplifier integrated circuit chip that has a gate jumper and segmented gate fingers. The gate jumper may be formed at a different vertical level on the chip (above an underlying substrate) than the gate fingers, and a polymer-based dielectric crossover may be provided between the gate jumper and an underlying conductive layer.

Pursuant to further embodiments of the present invention, packaged electronic circuits are provided in which the negatively-biased electrodes of capacitors included within the device are all located closer to the substrate than are the electrodes that are coupled to a higher voltage (e.g., ground, a positive voltage or a less negative voltage). This configuration moves the electrodes of the capacitors that are subject to high negative voltages farther away from the upper surface of the device, and hence farther away from a potential source of ions which can lead to device failure during, for example, a humility accelerated stress test.

Embodiments of the present invention will now be described in greater detail with reference to the attached figures. Prior to describing the encapsulation techniques according to embodiments of the present invention, two example packaged electronic circuits that may include the encapsulation techniques according to embodiments of the present invention will be described with reference to FIGS. 1 and 2.

Figure 1:
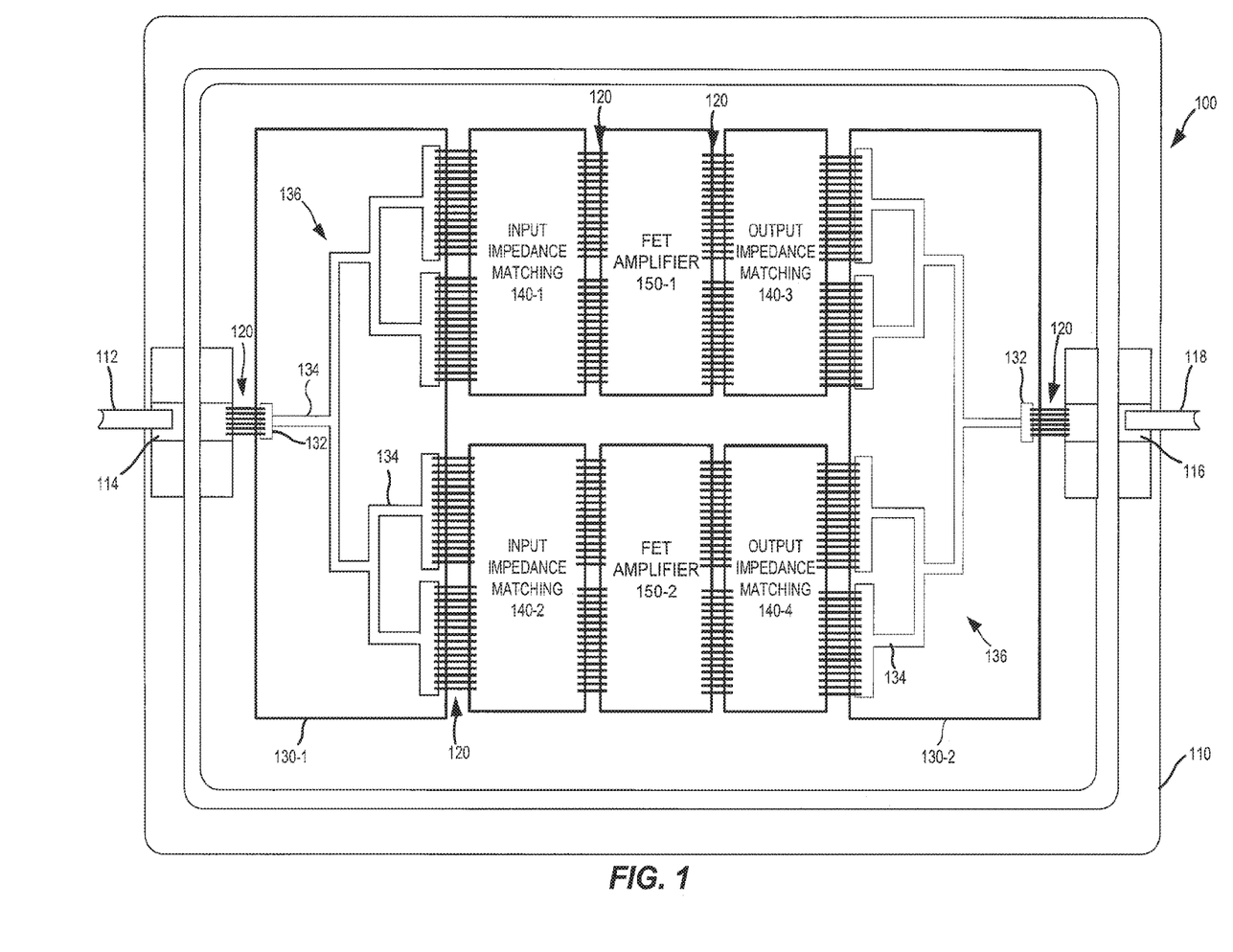
FIG. 1 is a schematic plan view of an internally-matched FET power amplifier.

FIG. 1 is a schematic plan view (i.e., a view looking down at the device from above) of a packaged internally-matched FET power amplifier 100 that includes a plurality of electronic circuit substrates that are contained within a package 110. The electronic circuit substrates may include one or more integrated circuit chips and may also include other electronic circuit substrates such as, for example, printed circuit boards or ceramic circuit substrates. Herein, integrated circuit chips and other electronic circuit substrates such as printed circuit boards or ceramic circuit substrates may be collectively referred to as "chips." In FIG. 1, the package 110 is shown in shadow view to illustrate the various elements within the package 110. The package 110 includes an input lead 112 that is electrically connected to an input pad 114 and an output lead 118 that is electrically connected to an output pad 116.

As shown in FIG. 1, the circuit substrates may include input/output circuit substrates 130-1, 130-2, impedance matching circuit substrates 140-1, 140-2, 140-3, 140-4, and field effect transistor amplifier integrated circuit chips 150-1, 150-2. Bond wires 120 are provided that interconnect the circuit substrates 130, 140, 150 and that connect the circuit substrates 130 to the package 110. Herein, when more than one instance of a particular element is included in a device the elements may be referred to individually by their full reference numeral (e.g., transistor amplifier integrated circuit chip 150-2) and collectively by the first part of the reference numeral (e.g., the transistor amplifier integrated circuit chips 150).

Each input/output circuit substrate 130 may comprise, for example, a ceramic circuit substrate (e.g., an alumina substrate) that has a conductive ground plane on one side thereof and conductive traces on the opposite side thereof that form RF transmission lines 134 and pads such as input/output bond pads 132. The RF transmission lines 134 form a corporate feed network 136 that connect the input/output bond pads 132 to the gate fingers of unit cell transistors that are included in the transistor amplifier integrated circuit chips 150.

The unit cell transistors that amplify the input signal are implemented on the first and second transistor amplifier integrated circuit chips 150-1, 150-2. Examples of suitable integrated circuit chips are disclosed, for example, in U.S. Patent Publication No. 2017/0271497, the entire content of which is incorporated herein by reference as if set forth fully herein.

The impedance of each transistor amplifier integrated circuit chip 150 typically will not be well-matched to the impedance seen at the input lead 112 or the output lead 118 (which may each be, for example, 50 ohms). Accordingly, the internally-matched FET power amplifier 100 further includes impedance matching circuit substrates 140 that improve the impedance match between the transistor amplifier integrated circuit chips 150 and the input lead 112 and the output lead 118 over the operating frequency band of the internally-matched FET power amplifier 100. Each input impedance matching circuit substrate 140 may include transmission lines and reactive components such as capacitors and/or inductive elements.

The impedance matching circuit substrates 140 may each comprise, for example, a substrate such as a ceramic substrate (e.g., an alumina substrate) or a printed circuit board that has capacitors, inductors and/or resistors formed thereon. In some cases, bond wires 120 that extend between the circuit substrates 130, 140, 150 may act as inductors, and capacitors may be formed on the circuit substrates 140 so that, for example, an inductor-capacitor-inductor (LCL) reactive circuit is formed at the input and output of each transistor amplifier integrated circuit chip 150.

Figure 2:
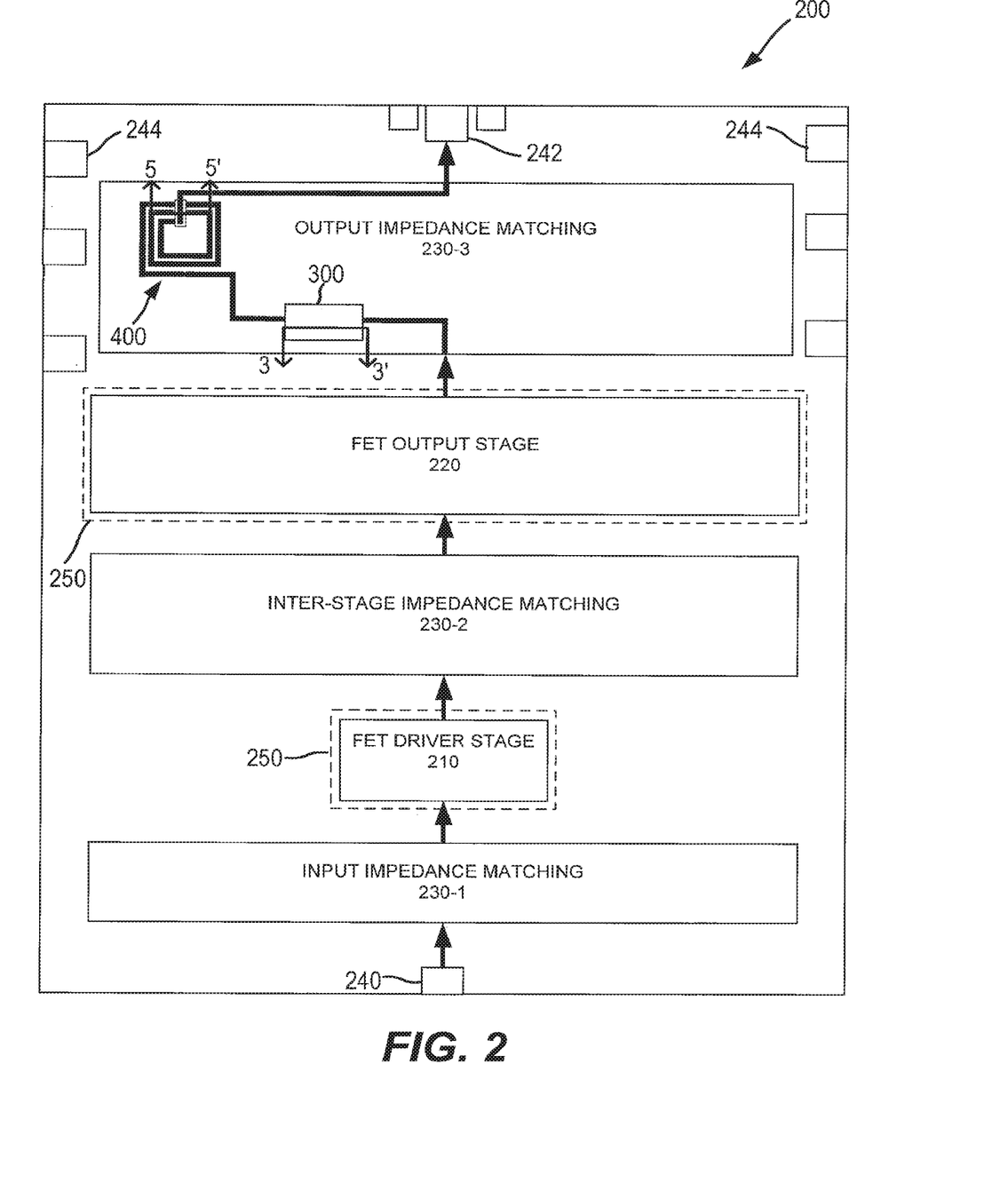
FIG. 2 is a schematic plan view of a MMIC power amplifier that includes matching circuits.

FIG. 2 is a schematic plan view of a two-stage MMIC power amplifier 200 that includes matching circuits. As shown in FIG. 2, the MMIC amplifier 200 includes a FET driver stage 210 and a FET output stage 220, which represent the two amplification stages of the two-stage MMIC amplifier 200. The MMIC amplifier 200 further includes an input impedance matching circuit 230-1, an inter-stage impedance matching circuit 230-2 and an output impedance matching circuit 230-3. An input pad 240 and an output pad 242 may also be provided, along with other pads 244 that provide power supply and ground connections for the MMIC amplifier 200.

An input signal (e.g., a 700 MHz RF signal) may be input to the MMIC amplifier 200 at input pad 240. The input signal is passed through the input stage impedance matching circuit 230-1 which may improve the impedance match between the input of the FET driver stage 210 and the input pad 240. The FET driver stage 210 amplifies the RF signal input thereto to provide a higher power RF signal. The higher power RF signal output by the FET driver stage 210 may be provided (after appropriate impedance matching by the inter-stage impedance matching circuit 230-2) as the input signal to the FET output stage 220. The FET output stage 220 further amplifies the RF signal. The high power RF signal output by the FET output stage 220 passes through the output stage impedance matching circuit 230-3 and is output at the output pad 242. The FET driver stage 210 and the FET output stage 220 may each be implemented, for example, as a plurality of unit cell FET transistors (e.g., HEMT transistors) that are electrically connected in parallel to each other.

Each of the impedance matching circuits 230 may comprise, for example, one or more capacitors, inductors, resistors and/or other circuit elements that are arranged to improve the match between the impedance of the RF signal input at the input to the impedance matching circuit 230 to the impedance of a circuit element at the output of the impedance matching circuit 230. While the impedance matching circuits 230 are illustrated schematically in FIG. 2, a plate capacitor 300 and a spiral inductor 400 are illustrated in the output impedance matching circuit 230-3 to illustrate typical implementations of these components.

Figure 3:
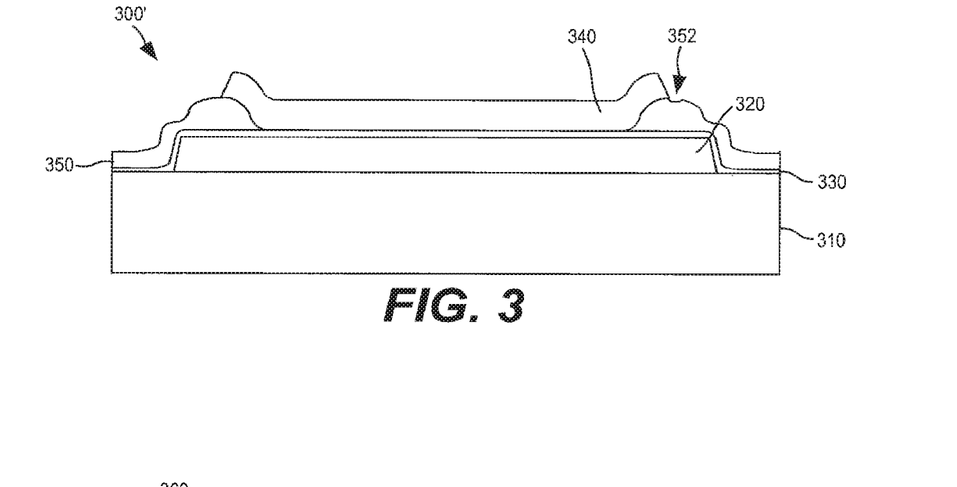
FIG. 3 is a schematic cross-sectional view taken along line 3-3 of FIG. 2 illustrating a capacitor that could be included in the MMIC power amplifier of FIG. 2.

As described above, both the internally-matched FET 100 and the MMIC amplifier 200 include reactive components such as capacitors and/or inductors. FIG. 3 is a schematic cross-sectional view of a capacitor 300' that has a similar design to the capacitors 300 that are shown in FIG. 2, except that the capacitor 300' does not include any moisture encapsulation. For context, the cross-section of FIG. 3 is taken along line 3-3' of FIG. 2 (with the caveat that the capacitor 300' of FIG. 3 does not include moisture encapsulation).

As shown in FIG. 3, the capacitor 300' may be formed on a substrate 310. When the capacitor 300' is included in a MMIC device such as the MMIC amplifier 200 of FIG. 2, the substrate 310 would typically be a semiconductor substrate such as a silicon carbide substrate or any other substrate on which semiconductor layers can be grown such as for example, a sapphire substrate. It will be appreciated, however, that in other cases, such as if the capacitor 300' was used in one of the impedance matching circuit substrates 140 of the internally matched FET 100 of FIG. 1, the substrate 310 may comprise some other type of substrate such as, for example, a printed circuit board or a ceramic substrate. It will also be appreciated that herein the term "substrate" is used broadly to encompass, for example, bare substrates or substrates with other layers grown or formed thereon such as semiconductor or non-semiconductor substrates that have epitaxial layers, dielectric layers, metal layers and the like formed thereon.

Figure 8:
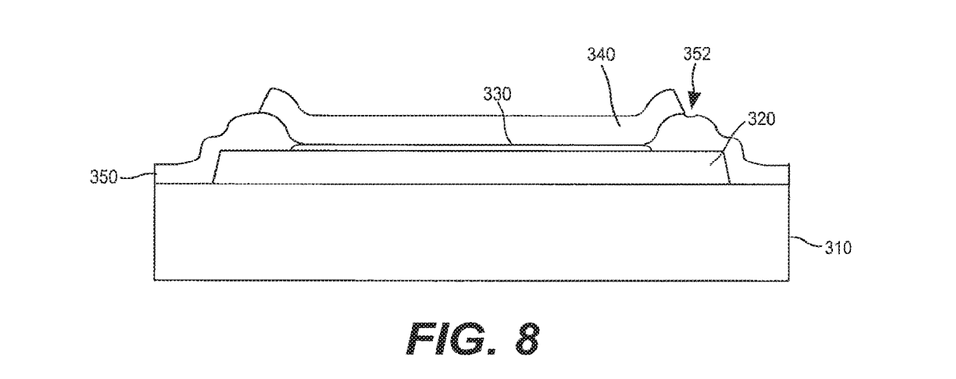
FIG. 8 is a schematic cross-sectional view illustrating a modified version of the capacitor of FIG. 3.

A first metal layer may be formed on the substrate 310 that acts as a lower electrode 320 of the capacitor 300'. A capacitor dielectric layer 330 is formed on an upper surface of the lower electrode 320. Any suitable capacitor dielectric layer may be used including, for example, silicon oxide, silicon nitride, high dielectric constant dielectric layers and the like. A second metal layer is formed on the capacitor dielectric layer 330 that acts as an upper electrode 340 of the capacitor 300. A dielectric crossover 350 is interposed between the lower electrode 320 and the upper electrode 340 around the periphery of the capacitor 300'. The dielectric crossover 350 may comprise a dielectric material (including air) that is substantially thicker (in a direction perpendicular to the substrate) than the capacitor dielectric layer 330 in some embodiments. The dielectric crossover 350 may comprise a carbon-based polymer material such as, for example, a polyimide or bcb cyclotene, PBO, (P-phenylene-2,6-benzobisoxazole), polyamides, spin-on-glass or the like. The inclusion of the dielectric crossover 350 around the periphery of the capacitor 300' may improve the reliability of the capacitor 300'. The dielectric crossover 350 is not interposed between central portions of the lower and upper electrodes 320, 340. While the capacitor dielectric layer 330 is provided between the lower electrode 320 and the dielectric crossover 350 in the depicted embodiment, it will be appreciated that the capacitor dielectric layer 330 may be fully or partially omitted in this region of the capacitor in other embodiments, as shown in FIG. 8.

If the capacitor 300' of FIG. 3 is operated in a humid environment, the water vapor in the ambient air may act as a source of hydrogen ions (or other halogen ions) that may lead to undesired chemical reactions within the packaged electronic circuit. When such ions are located near portions of the packaged electronic circuit that are under electric fields, the ions may act as catalysts for hydroxide formation or other chemical reactions. These chemical reactions may degrade the performance of various of the circuit elements. This may cause the capacitor 300' to short-circuit, which may result in failure of a packaged electronic circuit (e.g., the MMIC amplifier 200 of FIG. 2 or the internally-matched FET 100 of FIG. 1) that includes the capacitor 300'. For example, packaged electronic circuits may be subjected to humidity accelerated stress tests to ensure that the packaged electronic circuits will not prematurely fail due to humidity-induced failure mechanisms. High power packaged electronic circuits may be particularly prone to failure because the high electric fields and higher operating temperatures associated with such devices may result in increased ion movement and accelerated chemical reactions. A humidity accelerated stress test may involve placing the packaged electronic circuit in a high moisture content, high pressure environment for hours or days while the device is operated at or near its rated maximum power capabilities. These stress tests may be performed prior to packaging of the chip(s) that are included in the device. If the chip(s) have moisture paths that lead into the interior of the chip, the circuit may be likely to fail during the stress test, typically due to a short circuit that permanently damages the device. Thus, while the stress test may identify devices that are prone to moisture induced failure, the stress test also reduces manufacturing yields.

Figure 4:
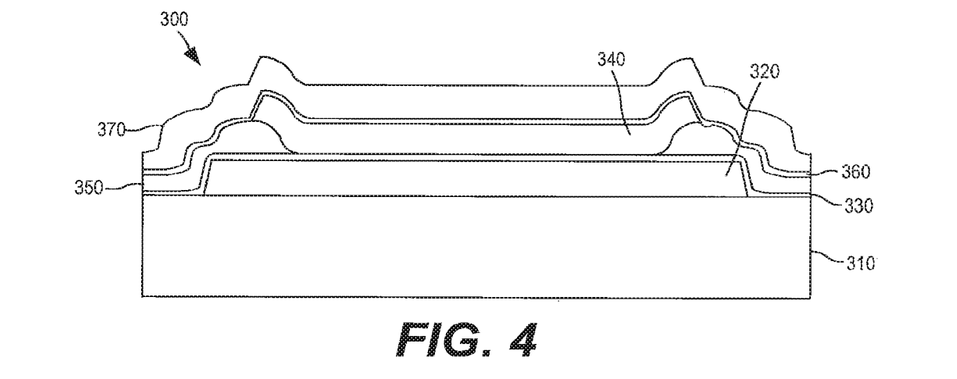
FIG. 4 is a schematic cross-sectional view of a capacitor according to some embodiments of the present invention that includes moisture encapsulation.

FIG. 4 is a schematic cross-sectional view of a capacitor 300 according to embodiments of the present invention that includes moisture encapsulation.

Referring to FIG. 4, the capacitor 300 may include one or more protective layers that encapsulate the capacitor in order to protect against such moisture ingress. For example, a protective dielectric layer 360 may be formed that encapsulates the upper surface of the capacitor 300. This protective dielectric layer 360 may comprise, for example, a silicon nitride layer, a silicon oxide layer, a silicon oxynitride layer or the like. The protective dielectric layer 360 may be formed by any appropriate means including chemical vapor deposition and/or atomic layer deposition. In some embodiments, the protective dielectric layer 360 may be blanket deposited over a top surface of a chip that includes the capacitor 300. In some embodiments, the protective dielectric layer 360 may be formed during wafer processing (i.e., before a wafer is diced to provide a plurality of chips). In such embodiments, the protective dielectric layer 360 may be blanket deposited across the wafer or may be blanket deposited except along scribe lines along which the wafer will later be diced. In some embodiments, the protective dielectric layer 360 may be done prior to "backside processing" of the wafer such as any grinding operation to reduce the thickness of the substrate, drilling of via holes in the wafer and/or backside metallization.

The protective dielectric layer 360 may not provide good coverage when formed on sidewalls of an underlying layer, particularly when the protective dielectric layer 360 is formed using chemical vapor deposition. Additionally, the dielectric crossover 350 may include a void in, for example, the region labelled 352 in FIG. 3, particularly when the dielectric crossover 350 is formed via chemical vapor deposition. When the protective dielectric layer 360 is formed on this void 352, microcracks may be formed in the protective dielectric layer 360 which may serve as pathways for moisture ingress through the protective dielectric layer 360. Accordingly, as shown in FIG. 4, in order to block those pathways, a protective polymer layer 370 may be formed on the protective dielectric layer 360. The protective polymer layer 370 may also be formed prior to backside processing of the wafer. The protective polymer layer 370 may comprise, for example, bcb cyclotene, PBO (P-phenylene-2,6-benzobisoxazole), polyamides, spin-on-glass, permanent resists such as SU-8 2000—MicroChem, epoxy mold compounds, epoxy resins and the like.

The capacitor 300 may be formed by sequentially forming the lower electrode 320, the capacitor dielectric layer 330 and the upper electrode 340 using, for example, conventional deposition, masking and etching processes. The dielectric crossover 350 may be formed before or after the upper electrode 340. The dielectric crossover 350 may substantially fill the space between the outer periphery of the upper electrode 340 and the lower electrode 320 as shown in FIG. 8 or, alternatively, the space between the outer periphery of the upper electrode 340 and the capacitor dielectric layer 330, as shown in FIG. 3. The dielectric crossover 350 may not be formed in the middle portion of the capacitor (i.e., it is only formed along the outer edge). In some embodiments, the dielectric crossover 350 may be formed after the formation of the upper electrode 340. As discussed above, the dielectric crossover 350 may comprise, for example, a carbon-based polymer layer. The dielectric crossover 350 may be formed at a first temperature. In some embodiments, the first temperature may be greater than 200° C. In some embodiments, the first temperature may be between 200-450° C. In other embodiments, the first temperature may be greater than 220° C. or 240° C. In some additional example embodiments, the first temperature may be between 220°–450° C., between 220-400° C., between 240-450° C. or between 240-400° C.

The protective dielectric layer 360 may be formed on the dielectric crossover 350 and the upper electrode 340. In some embodiments, the protective dielectric layer 360 may be blanket deposited to cover the entire chip or an entire wafer that includes a plurality of chips. The protective dielectric layer 360 may be formed at a second temperature. The second temperature may be less than the first temperature. This may reduce or prevent off-gas sing of material from the dielectric crossover. In some embodiments, the second temperature may be at least 160° C. or at least 180° C. while being less than the first temperature. In some example embodiments the second temperature may be between 160-400° C., between 18-400° C., between 160-340° C. or between 180-340° C. while also being less than the first temperature.

The protective polymer layer 370 may be formed on the protective dielectric layer 360. In some embodiments, the protective polymer layer 370 may be blanket deposited to cover the entire chip or wafer. In other embodiments, the protective polymer layer 370 may be blanket deposited and then selectively removed (e.g., via etching or photolithography) or, alternatively, may be selectively deposited so that the protective polymer layer 370 only covers portions of the chip (including portions having the dielectric crossovers 350). For example, in some embodiments, the protective polymer layer 370 may not cover some or all of the transistors that are included on the chip. Omitting (or removing) the protective polymer layer 370 from on top of the transistors may improve the performance of the transistors, particularly in high frequency (e.g., RF) applications. Omitting the protective polymer layer 370 above the transistors may also facilitate allowing heat that is generated in the FET transistors during device operation to dissipate from the chip. The dashed boxes labelled 250 in FIG. 2 illustrate the regions of the MMIC chip 200 where the protective polymer layer 370 may be omitted. The protective dielectric layer 360 may be blanket deposited over the entire upper surface of the MMIC amplifier 200, and the protective polymer layer 370 may be provided across the entire top surface except for within the dashed boxes 250.

The protective polymer layer 370 may be formed at a third temperature. The third temperature may be less than the second temperature. This may reduce or prevent off-gassing of material from the dielectric crossover 350 and/or the protective dielectric layer 360. In some embodiments, the third temperature may be at least 130° C. or at least 150° C. while being less than the second temperature. In some example embodiments the third temperature may be between 130-240° C., between 130-200° C., between 150-240° C. or between 150-200° C. while also being less than both the first temperature and the second temperature. The protective polymer 370 may be cured so that the polymers at least partially crosslink.

The protective polymer layer 370 may comprise, for example, a carbon-containing material such as, for example, a polyimide. In some embodiments, the protective polymer layer 370 may be spin-coated onto the chip.

In a typical design, the first metal layer that forms the lower electrode 320 for the capacitor 300 may have a thickness of, for example, about 1-5 microns. The capacitor dielectric layer 330 may have a thickness of, for example, 0.1-0.7 microns, and the thickness may be varied based on the material (or dielectric constant thereof) used to form the capacitor dielectric layer 330 and a desired level of capacitance for the capacitor 300. The second metal layer that forms the upper electrode 340 may have a thickness of, for example, about 1-5 microns. The polymer-based dielectric crossover 350 may have a thickness of, for example, about 1-3 microns. The protective dielectric layer 360 may be a thinner layer having a thickness of, for example, about 0.2-1 microns in some embodiments. In other embodiments, the thickness may be between 0.4 and 0.8 microns or between 0.4 and 0.6 microns. The protective polymer layer 370 may have a thickness of about 1.5-5 microns in some embodiments. In other embodiments, the thickness may be between 2.0 and 4.0 microns or between 2.5 and 3.5 microns.

In other embodiments, the protective polymer layer 370 may be formed on the dielectric crossover 350 and the protective dielectric layer 360 may then be formed on the protective polymer layer 370. The protective polymer layer 370 and the dielectric crossover 350 may be different materials. In such embodiments, the protective dielectric layer 360 may be deposited, at least in part, by atomic layer deposition.

In some embodiments, additional layers may be formed on the dielectric crossover 350. For example, an adhesion layer could be provided between the protective dielectric layer 360 and the protective polymer layer 370. Moreover, while the capacitor dielectric layer 330 is provided between the lower electrode 320 and the dielectric crossover 350 in the depicted embodiment, it will be appreciated that the capacitor dielectric layer 330 may be fully or partially omitted in this region of the capacitor in other embodiments.

In some embodiments, the protective dielectric layer 360 and the protective polymer layer 370 may be formed prior to dicing of the semiconductor wafer. For example, the protective dielectric layer 360 and the protective polymer layer 370 may be formed after processing of the top (device) side of the wafer is completed, but prior to any backside processing of the wafer such as grinding of the wafer to reduce its thickness, formation of via holes through the wafer and/or backside metallization. It will also be appreciated that other layers such as, for example, an adhesion layer, may be formed immediately underneath the protective dielectric layer 360 and/or between the protective dielectric layer 360 and the protective polymer layer 370.

As noted above, when dielectric crossovers are included on a circuit substrate, small voids may form in the upper surface thereof, particularly at upper edges of the dielectric crossover. When a passivation layer is formed on these voids, microcracks may form in the passivation layer which may serve as moisture paths into the interior of the device. While dielectric crossovers may be used in capacitors as discussed above with reference to FIGS. 3 and 4, it will be appreciated that dielectric crossovers may be used in in forming other circuit elements, such as inductors and gate jumpers.

Figure 5:
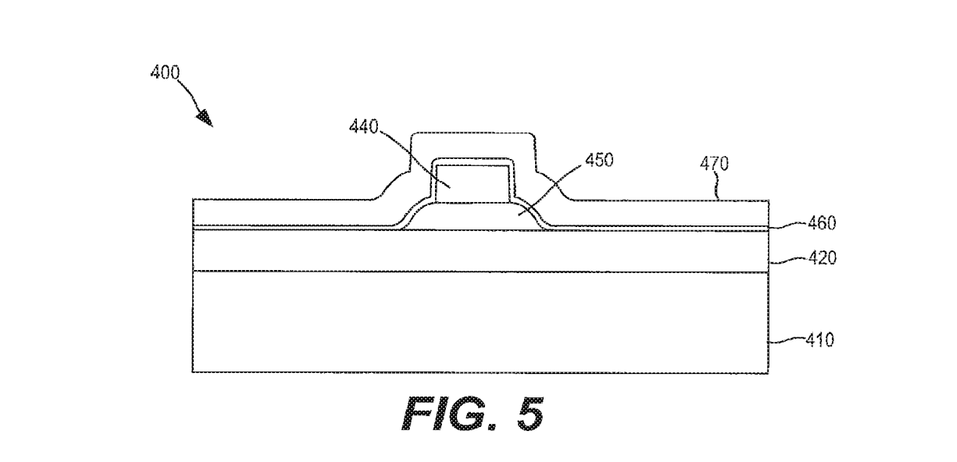
FIG. 5 is a schematic cross-sectional view taken along line 5-5' of FIG. 2 illustrating one of the inductors included in the MMIC power amplifier of FIG. 2 that includes moisture encapsulation.

For example, FIG. 5 is a cross-sectional view taken along line 5-5' of FIG. 2 that illustrates a design of one of the inductors 400 of MMIC amplifier 200 in greater detail. The inductor 400 also includes encapsulation according to embodiments of the present invention. It will be appreciated that the inductor 400 could also be included in one of the impedance matching circuit substrates 140 of the internally-matched FET amplifier 100 of FIG. 1.

As shown in FIG. 5, the inductor 400 may be formed on a substrate 410. In the embodiment of FIG. 5, where the inductor 400 is part of a MMIC device, the substrate 410 would typically be a semiconductor substrate such as a silicon carbide substrate or a substrate on which semiconductor layers can be grown such as for example, a silicon or sapphire substrate. The substrate 410 may include epitaxially grown semiconductor layers. It will be appreciated, however, that in other cases, such as when the inductor 400 is part of one of the impedance matching circuit substrates 140 of the internally matched FET 100 of FIG. 1, the substrate 410 may comprise some other type of substrate such as, for example, a printed circuit board or a ceramic substrate.

A first metal trace 420 may be formed on the substrate 410. The metal trace 420 may have a spiral shape (see FIG. 2). As a result, the first metal trace 420 has closely-spaced side-by-side sections where the sections have substantially the same instantaneous current direction. A second metal trace 440 is formed on the first metal trace 420. A dielectric crossover 450 is interposed between the first metal trace 420 and the second metal trace 440 in order to prevent a short circuit between the first and second metal traces 420, 440. The dielectric crossover 450 may comprise a carbon-based polymer material such as, for example, a polyimide or any of the above discussed materials that may be used to form the dielectric crossover 350.

The inductor 400 further includes a protective dielectric layer 460 and a protective polymer layer 470 that are sequentially formed on the second metal trace 440 and the dielectric crossover 450. The protective dielectric layer 460 may encapsulate the upper surface of the inductor 400. This protective dielectric layer 460 may comprise, for example, a silicon nitride layer, a silicon oxide layer, a silicon oxynitride layer or the like. The protective dielectric layer 460 may be formed by any appropriate means including chemical vapor deposition and/or atomic layer deposition. In some embodiments, the protective dielectric layer 460 may be blanket deposited over a top surface of the chip. In some embodiments, the protective dielectric layer 460 may be formed during wafer processing (i.e., before a wafer is diced to provide a plurality of chips). In such embodiments, the protective dielectric layer 460 may be blanket deposited across the wafer or may be blanket deposited except along scribe lines where the wafer will later be diced. The protective polymer layer 470 may be formed on the protective dielectric layer 460. The protective dielectric layer 460 and the protective polymer layer 470 may be identical to the protective dielectric layer 360 and the protective polymer layer 370 that are discussed above with reference to FIG. 4, and hence further description thereof will be omitted.

When fabricating the inductor 400, the dielectric crossover 450 may be formed at a first temperature (e.g., a temperature between 200-450° C.). The protective dielectric layer 460 may be formed on the dielectric crossover 450 and the second metal trace 440. The protective dielectric layer 460 may be formed at a second temperature that is less than the first temperature to prevent off-gassing of material from the dielectric crossover 450 or other underlying layers of the device. In some embodiments, the second temperature may be between 180-400° C. while also being less than the first temperature. The protective polymer layer 470 may be formed on the protective dielectric layer 460 at a third temperature that is less than the second temperature to prevent off-gassing from underlying layers. In some embodiments, the third temperature may be between 150-240° C. while also being less than both the first temperature and the second temperature. The protective polymer layer 470 may be cured so that the polymers crosslink or may be partially cured in some embodiments. The protective polymer layer 470 may comprise, for example, a carbon-containing material. In some embodiments, the protective polymer layer 470 may be spin-coated onto the chip. It will be appreciated that the additional ranges for the first, second and third temperatures that are discussed above with reference to the embodiment of FIG. 3 apply equally to the present embodiment.

In some embodiments, the protective polymer layer 470 may be blanket deposited to cover the entire chip. In other embodiments, the protective polymer layer 470 may be blanket deposited and then selectively removed (e.g., via etching or photolithography) or, alternatively, may be selectively deposited so that the protective polymer layer 470 only covers portions of the chip (including portions having the dielectric crossovers 450). For example, in some embodiments, the protective polymer layer 470 may not cover some or all of the transistors that are included on the chip. Omitting (or removing) the protective polymer layer 470 from on top of the transistors may improve the performance of the transistors, particularly in high frequency (e.g., RF) applications. Omitting the protective polymer layer 470 above the transistors may also facilitate allowing heat that is generated in the transistors during device operation to dissipate from the chip.

Pursuant to still further embodiments of the present invention, power amplifier integrated circuit chips are provided that have moisture encapsulation. These integrated circuit chips may include a plurality of unit cell transistors. In some embodiments, the transistors may include gate jumpers that provide lower resistance connections between a gate electrode or a gate pad and respective portions of a plurality of segmented gate fingers. Dielectric crossovers may be provided between the gate jumpers and underlying conductive portions of the device such as source regions for the transistors. The moisture encapsulation techniques according to embodiments of the present invention may be used to encapsulate these dielectric crossovers and thereby reduce or prevent moisture ingress in the vicinities of the respective dielectric crossovers.

Figure 6A:
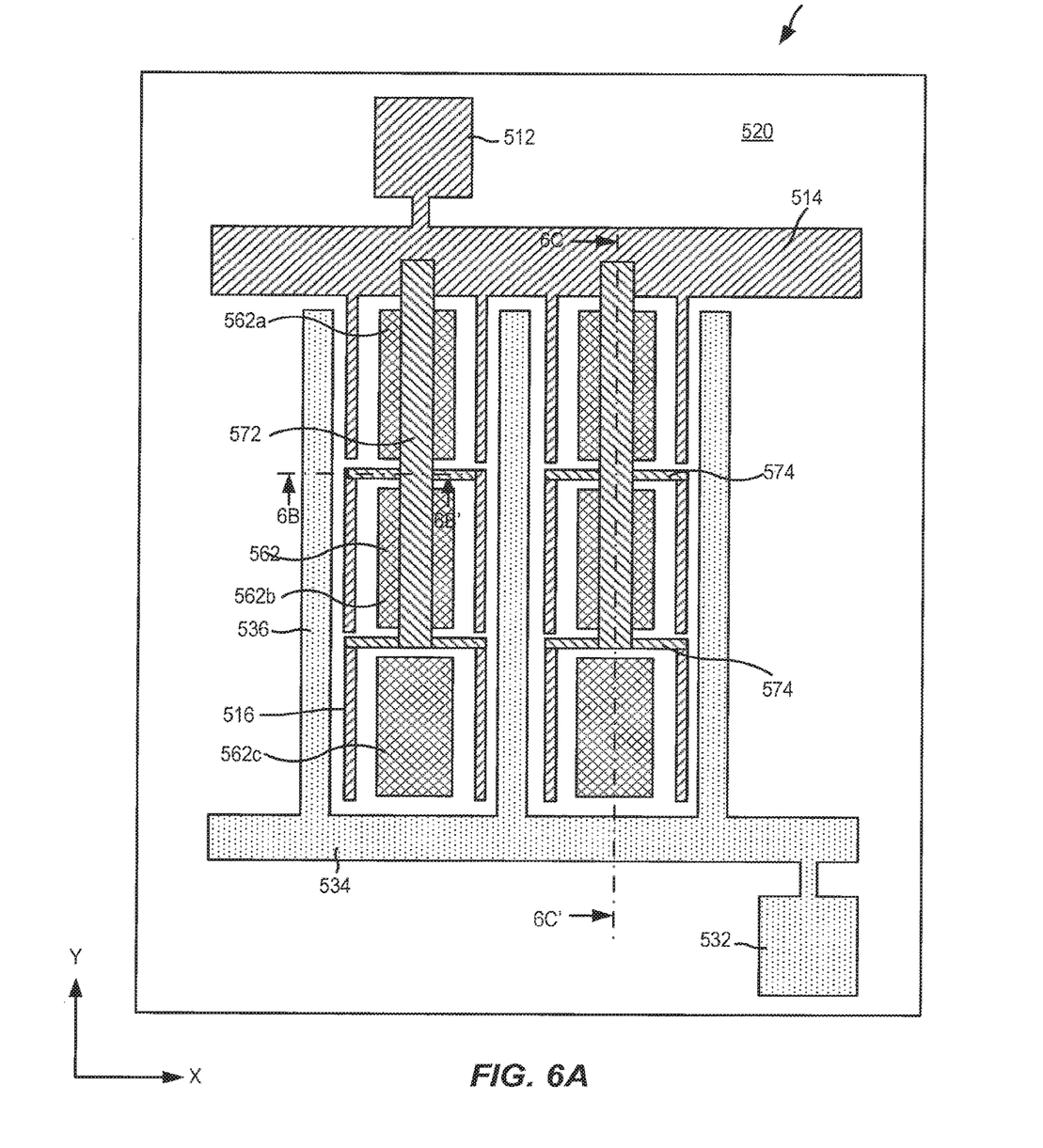
FIG. 6A is a schematic plan view of a metal layout of a portion of a power amplifier integrated circuit chip in accordance with some embodiments of the present invention.
Figure 6B:
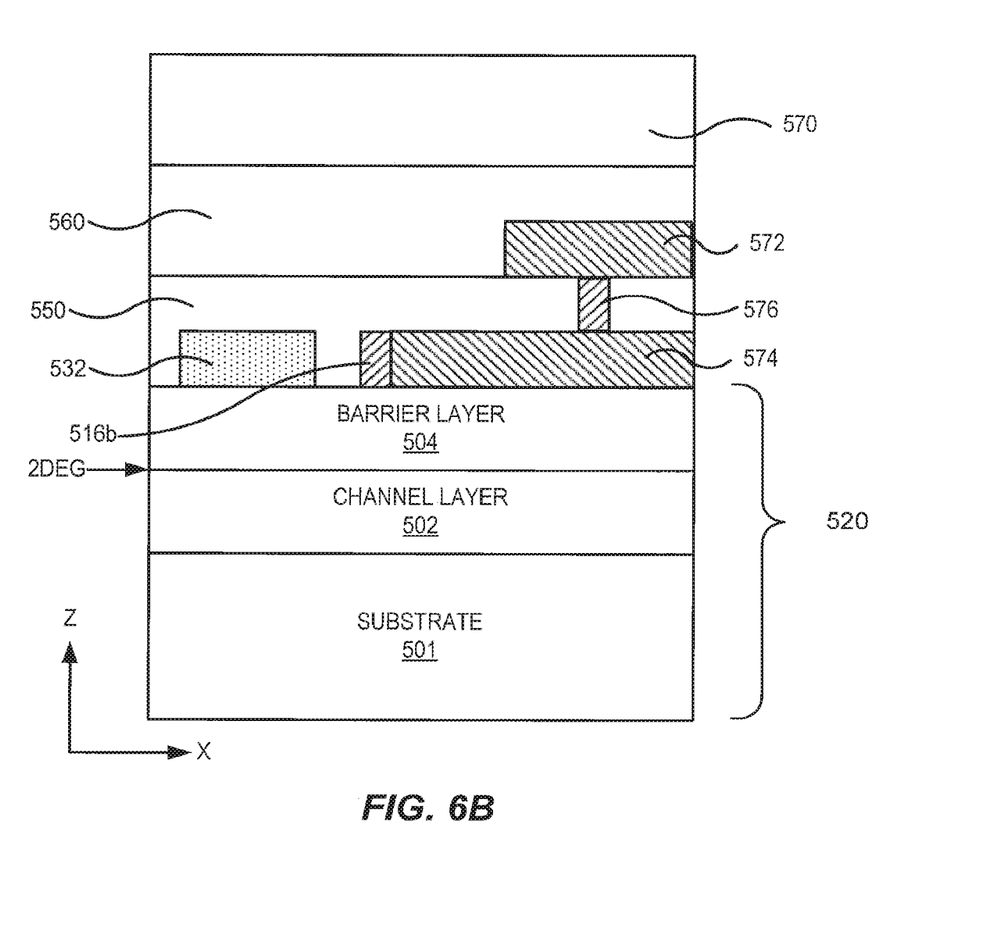
FIG. 6B is a cross-sectional view taken along line 6B-6B' of FIG. 6A.
Figure 6C:
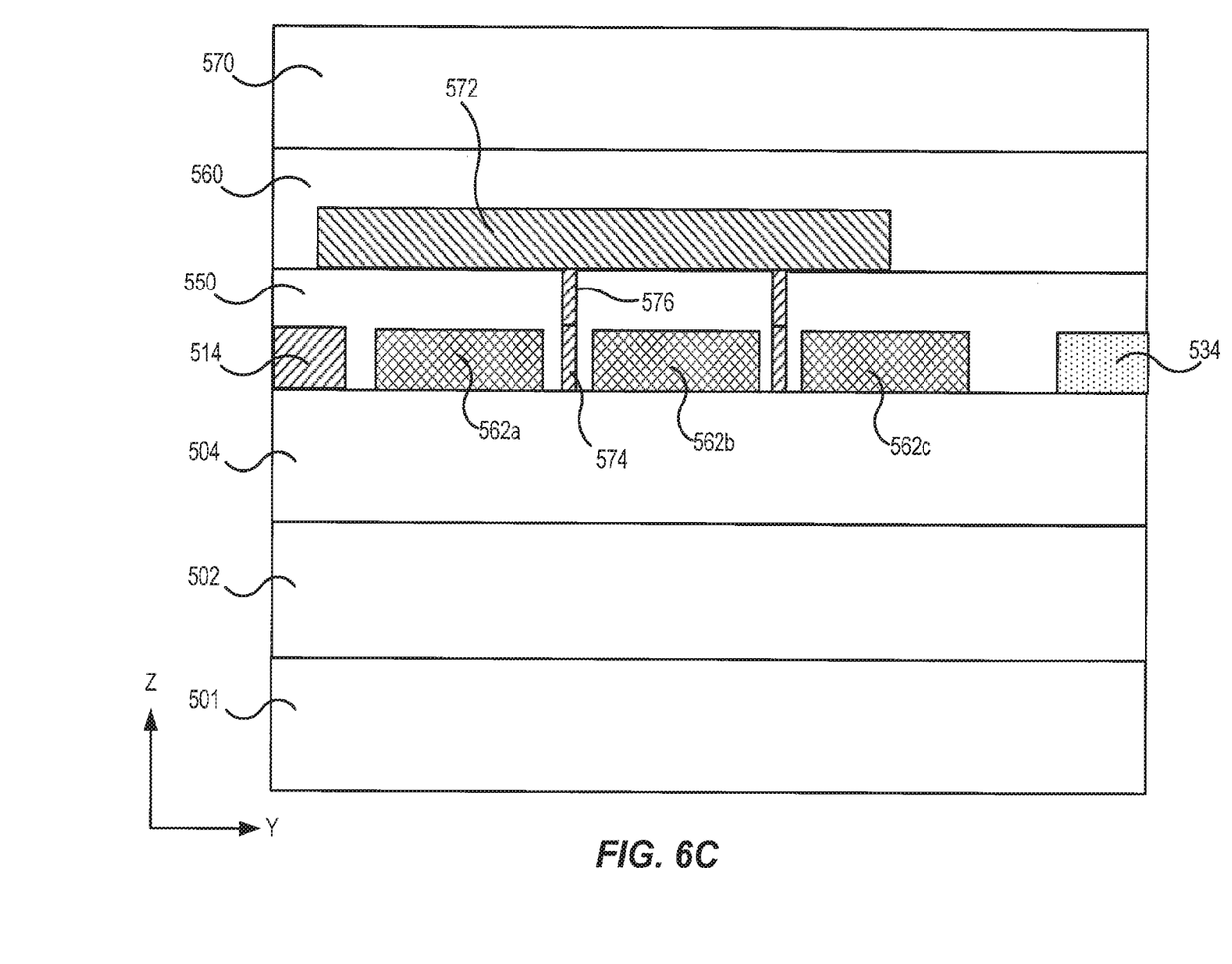
FIG. 6C is a cross-sectional view taken along line 6C-6C of FIG. 6A.

FIGS. 6A-6C are a schematic plan view and a pair of schematic cross-sectional views of a portion of a power amplifier integrated circuit chip 500 that includes moisture encapsulation according to embodiments of the present invention. In FIG. 6A, only the metal portions of the device are shown to better illustrate the device structure.

As shown in FIGS. 6A-6C, the power amplifier 500 comprises a semiconductor structure 520 that includes one or more layers including, for example, a substrate 501, a channel layer 502 and a barrier layer 504. Other layers (not shown) may be included in the semiconductor structure 520. The plan view of FIG. 6A is simplified for ease of understanding and includes a gate pad 512 that is connected to a gate bus 514 and a drain pad 532 that is connected to a drain bus 534. The source pad and source bus are omitted from FIG. 6A to simplify the drawing, but it will be understood that one or both of a source pad and a source bus may be provided that electrically connect to each of the source contacts shown in FIG. 6A.

As shown in FIGS. 6A-6C, a plurality of gate fingers 516 are connected to the gate bus 514 and extend in the y-direction. In the depicted embodiment, each gate finger 516 is divided in the y-direction into three gate finger segments 516a, 516b and 516c that are separated from each other by gaps. It will be appreciated that in other embodiments the gate fingers 516 may not be segmented in this fashion and instead each gate finger 516 may comprise a single, integral gate finger. A plurality of drain contacts 536 are connected to the drain bus 534 and extend in parallel with and adjacent respective ones of the gate fingers 516. Source contacts 562 are also provided and extend in the y-direction in parallel with adjacent ones of the gate fingers 516. The source contacts 562 are also divided in the y-direction into respective source contact segments 562a, 562b and 562c that are separated from each other by gaps. The source contact segments 562a, 562b, 562c may be electrically connected to each other by, for example, source contact plugs (not shown) that electrically connect each source contact segment 562a, 562b, 562c to a common conductive layer that acts as a source bus.

The gate fingers 516 extend in parallel with the source contacts 562. Because the gate fingers 516 and source contacts 562 are segmented, a plurality of unit cells are defined along each gate finger 516. The power amplifier 500 further includes a plurality of gate jumpers 572 that extend along the y-direction in parallel with the gate fingers 516. The gate jumpers 572 may be formed at a level that is different from the level of the source contact segments 562, the gate fingers 516 and the gate buses 514. The gate jumpers 572 may be formed over the source contacts 562, and may be insulated from the source contacts 562 by, for example, a dielectric crossover 550. The gate jumpers 572 are electrically connected to the gate buses 514. The gate jumpers 572 may electrically connect some or all of the gate finger segments 516a-516c to the gate bus 514.

FIG. 6B is a cross section taken along line 6B-6B' of FIG. 6A. FIG. 6C is a cross section taken along line 6C-6C' of FIG. 6A. As can be seen in FIGS. 6B and 6C, each gate jumper 572 may be electrically connected to the gate finger segments 516b, 516c via gate signal distribution bars 574 and vertical contact plugs 576 in order to electrically connect each gate finger segment 516b-516c to the gate bus 514. The gate signal distribution bars 574 may be formed at a higher metal layer in the device than the gate fingers 516. The vertical contact plugs 576 may connect the gate signal distribution bars 574 to the gate finger segments 516b, 516c.

The gate jumper 572 may be wider and/or thicker than the gate finger segments 516a-516c. A signal applied to the gate bus 514 is carried to gate finger segments 516b, 516c through the gate jumper 574. The larger cross sectional area of the gate jumper 572 may be better able to handle higher current densities than the gate fingers 516 without the problems normally associated with increased gate widths, such as electromigration and reduction of high frequency gain performance.

Dielectric crossovers 550 may be used to electrically isolate the source contact segments 562a-562c from each respective gate jumper 572. As can be seen in FIGS. 6B and 6C, a protective dielectric layer 560 and a protective polymer layer 570 are formed on the gate jumper 572 and the dielectric crossover 550. The dielectric layer 560 may be the same as the above-described dielectric layers 360, 460, and the protective polymer layer 570 may be the same as the above-described protective polymer layers 370, 470.

Pursuant to further embodiments of the present invention, MMIC power amplifiers are provided that may exhibit improved reliability when operating in humid environments. These MMIC power amplifiers may include the above described humidity protection encapsulation including a protective dielectric layer and a protective polymer layer that may be formed on top of a pair of metal layers that are separated by a dielectric crossover. In addition, the connections to the electrodes of the capacitors included in these MMIC power amplifiers may be oriented in a manner that reduces the likelihood of biased humidity failures.

In particular, it has been discovered that the polarity of the capacitors may be a leading mechanism for biased humidity failures of MMIC power amplifiers. As discussed above, capacitors are typically included on MMIC power amplifiers as part of impedance matching circuits that are used to improve the impedance matching and hence the return loss performance of the device. These capacitors are often electrically connected between the gate electrodes of the transistors and ground (where either the source electrode or the drain electrode is also coupled to ground). The capacitors are typically implemented as shown above with reference to FIGS. 2 and 3 as plate capacitors formed using two metal layers that are separated by a capacitor dielectric layer.

Ion ingress may occur through any passivation layer or humidity protection encapsulation and into the dielectric crossover. As noted above, one electrode of the capacitor may be coupled to ground, while the other electrode may be coupled to the gate electrode and hence may have a significant negative bias voltage applied thereto. If the upper electrode of the capacitor is coupled to the gate electrode, then any ions that ingress through the encapsulation and into the dielectric crossover may be subject to a high electric field. If this occurs, the ions may become mobile and may act as catalysts for hydroxide formation and subsequent ionic reactions near the capacitors. These reactions may result in short circuits developing, which typically result in device failure.

Pursuant to embodiments of the present invention, the electrode of each capacitor in the MMIC power amplifier that is coupled to the gate fingers of the transistors may be the lower electrode, since the lower electrode is spaced farther apart from the humidity protection encapsulation. This design moves the negatively biased electrode of the capacitor farther away from the potential source of ions, which may significantly reduce the biased humidity failure rate for a MMIC power amplifier.

Figure 7:
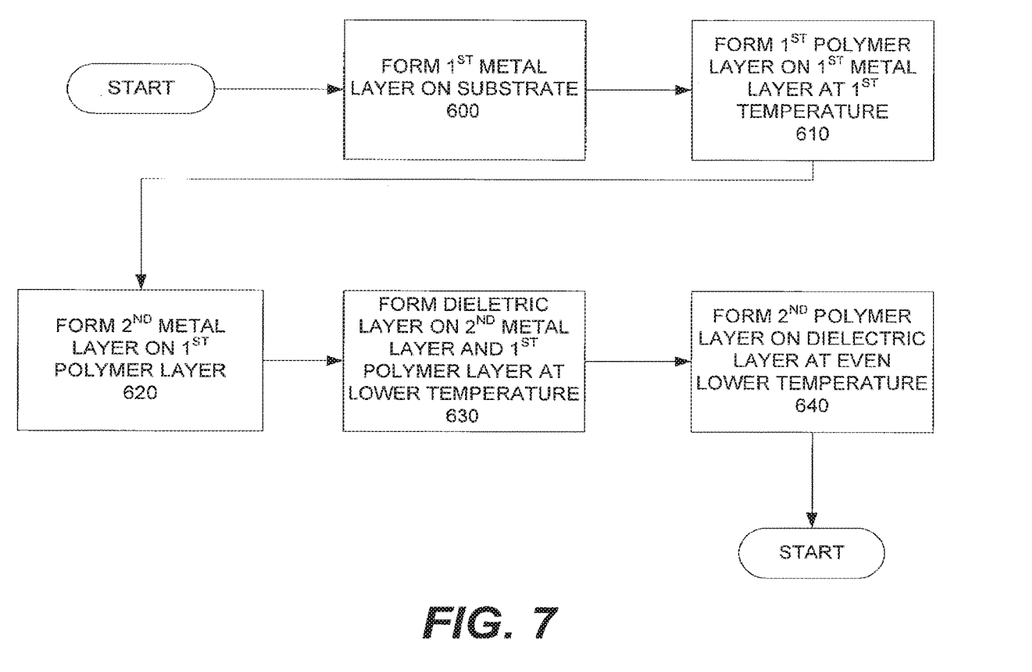
FIG. 7 is a flow chart of a method of forming a packaged electronic circuit according to some embodiments of the present invention.

FIG. 7 is a flow chart of a method of fabricating a packaged electronic circuit according to some embodiments of the present invention. As shown in FIG. 7, operations may begin with forming a first metal layer on a substrate (block 600). A first polymer layer may then be formed at a first temperature on a top surface of at least a portion of the first metal layer (block 610). A second metal layer is then formed on a top surface of the first polymer layer opposite the first metal layer (block 620). A dielectric layer is then formed at a second temperature on a top surface of the second metal layer and on a top surface of the first polymer layer (block 630). The second temperature may be less than the first temperature. Finally, a second polymer layer is formed at a third temperature on a top surface of the dielectric layer (block 640). The third temperature may be less than the second temperature.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A packaged electronic circuit, comprising:
   a substrate having an upper surface;
   a first metal layer on the upper surface of the substrate;
   a first dielectric layer on the first metal layer;
   a first polymer layer on the first metal layer;
   a second metal layer on the first polymer layer such that a portion of the first dielectric layer is between the first metal layer and the first polymer layer, and a portion of the first polymer layer is between the first dielectric layer and the second metal layer,
   wherein the first metal layer, the first dielectric layer and the second metal layer form a capacitor.

2. The packaged electronic circuit of claim 1, wherein the first polymer layer is between the first metal layer and a periphery of the second metal layer, and wherein the first polymer layer has a thickness in a direction perpendicular to the upper surface of the substrate that is greater than a thickness of the first dielectric layer.

3. The packaged electronic circuit of claim 2, wherein the periphery of the second metal layer is spaced farther above the first metal layer than is a center of the second metal layer.

4. The packaged electronic circuit of claim 3, wherein the first metal layer is coupled to a gate of a transistor.

5. The packaged electronic circuit of claim 1, wherein the first polymer layer is not between a center of the second metal layer and the first metal layer.

6. The packaged electronic circuit of claim 1, wherein the electronic circuit comprises a power amplifier integrated circuit chip having a unit cell transistor that includes a channel layer and a barrier layer, wherein the first metal layer comprises a source contact, and wherein the second metal layer comprises a gate jumper that is coupled between a gate electrode and a gate finger of a transistor.

7. The packaged electronic circuit of claim 1, wherein the electronic circuit is an internally matched field effect transistor or a ceramic substrate or a printed circuit board that has capacitors and/or inductors formed thereon.

8. The packaged electronic circuit of claim 1, further comprising:
   a second dielectric layer on the first polymer layer and on at least a portion of the second metal layer; and
   a second polymer layer on the second dielectric layer.

9. The packaged electronic circuit of claim 8, wherein the first polymer layer directly contacts an upper surface of the first dielectric layer, the second dielectric layer directly contacts an upper surface of the first polymer layer, and the second polymer layer directly contacts an upper surface of the second dielectric layer.

10. The packaged electronic circuit of claim 8, wherein the first polymer layer directly contacts the first metal layer, the second metal layer, the first dielectric layer, and the second dielectric layer.

11. The packaged electronic circuit of claim 1, wherein the first polymer layer is between a first edge of the second metal layer and the first metal layer.

12. A packaged electronic circuit, comprising:
a substrate having an upper surface;
a first metal layer on the upper surface of the substrate;
a first polymer layer on the first metal layer opposite the substrate;
a second metal layer on the first polymer layer opposite the first metal layer;
a dielectric layer on the first polymer layer and at least a portion of the second metal layer; and
a second polymer layer on the dielectric layer,
wherein the second metal layer comprises a gate jumper that is coupled between a gate electrode and a gate finger of a transistor.

13. A packaged electronic circuit, comprising:
a substrate having an upper surface;
a first metal layer on the upper surface of the substrate;
a first polymer layer on the first metal layer opposite the substrate;
a second metal layer on the first polymer layer opposite the first metal layer;
a dielectric layer on the first polymer layer and at least a portion of the second metal layer; and
a second polymer layer on the dielectric layer,
wherein the first metal layer comprises a metal trace that includes self-coupling sections that have a substantially same instantaneous current direction.

14. A packaged electronic circuit, comprising:
a substrate having an upper surface;
a first metal layer on the upper surface of the substrate;
a first polymer layer on the first metal layer opposite the substrate;
a second metal layer on the first polymer layer opposite the first metal layer;
a dielectric layer on the first polymer layer and at least a portion of the second metal layer; and
a second polymer layer on the dielectric layer,
wherein the packaged electronic circuit is a monolithic microwave integrated circuit, and wherein a plurality of transistors are provided on the substrate, and wherein the dielectric layer is formed on upper surfaces of the transistors and the second polymer layer is not formed on the upper surfaces of the transistors.

15. A packaged electronic circuit, comprising:
a substrate having an upper surface;
a first metal layer on the upper surface of the substrate;
a first polymer layer on the first metal layer opposite the substrate;
a second metal layer on the first polymer layer opposite the first metal layer;
a first dielectric layer between the first metal layer and the second metal layer;
a second dielectric layer on the first polymer layer and at least a portion of the second metal layer; and
a second polymer layer on the second dielectric layer,
wherein the first dielectric layer comprises at least one of silicon oxide, silicon nitride and silicon oxynitride and the second dielectric layer comprises at least one of silicon oxide, silicon nitride and silicon oxynitride,
wherein the first polymer layer directly contacts the first metal layer, the second metal layer, the first dielectric layer, and the second dielectric layer.

16. A packaged electronic circuit, comprising:
a substrate having an upper surface;
a first metal layer on the upper surface of the substrate;
a first polymer layer on the first metal layer opposite the substrate;
a second metal layer on the first polymer layer opposite the first metal layer;
a first dielectric layer between the first metal layer and the second metal layer;
a second dielectric layer on the first polymer layer and at least a portion of the second metal layer; and
a second polymer layer on the second dielectric layer,
wherein the first dielectric layer comprises at least one of silicon oxide, silicon nitride and silicon oxynitride and the second dielectric layer comprises at least one of silicon oxide, silicon nitride and silicon oxynitride,
wherein the first dielectric layer is between the first metal layer and the first polymer layer, and the first polymer layer is between the first dielectric layer and the second metal layer.

* * * * *